United States Patent [19]
Saeki et al.

[11] Patent Number: 4,946,633
[45] Date of Patent: Aug. 7, 1990

[54] METHOD OF PRODUCING SEMICONDUCTOR DEVICES

[75] Inventors: Junichi Saeki; Aizo Kaneda, both of Yokohama; Shigeharu Tsunoda, Fujisawa; Isamu Yoshida, Yokohama; Kunihiko Nishi, Kokubunji, all of Japan

[73] Assignee: Hitachi, Ltd., Tokyo, Japan

[21] Appl. No.: 184,790

[22] Filed: Apr. 22, 1988

[30] Foreign Application Priority Data

Apr. 27, 1987 [JP] Japan ..................... 62-101906
Oct. 23, 1987 [JP] Japan ..................... 62-266342
Mar. 16, 1988 [JP] Japan ..................... 63-60551

[51] Int. Cl.$^5$ ..................... B29C 45/02; B29C 45/14
[52] U.S. Cl. ..................... 264/40.1; 264/40.5; 264/272.17; 264/328.4; 264/328.9; 264/328.12; 425/116; 425/812
[58] Field of Search ..................... 264/272.17, 272.14, 264/40.1, 40.5, 328.4, 328.9, 328.12; 437/207, 211; 425/116, 125, 812

[56] References Cited

FOREIGN PATENT DOCUMENTS 217313 12/1983 Japan ..................... 264/272.17
4234 1/1986 Japan ..................... 264/272.17
292330 12/1986 Japan .
122136 6/1987 Japan .
157143 10/1987 Japan .

Primary Examiner—James Lowe
Attorney, Agent, or Firm—Antonelli, Terry, Stout & Kraus

[57] ABSTRACT

Apparatus for producing semiconductor devices is provided with mold and lead frame suitable for improving the production efficiency and product quality. Also disclosed is a method of producing semiconductor devices by means of the apparatus. The mold is characterized by the shape of a die and has a plurality of pots for pressure-feeding resin, a flow passage communicating the pots with each other so as to uniformalize the molding pressure applied to the pots even if there are variations in the weights of the resin charged in the pots, and a plurality of cavities disposed in series.

25 Claims, 25 Drawing Sheets

METHOD OF PRODUCING SEMICONDUCTOR DEVICES

BACKGROUND OF THE INVENTION

The present invention relates to apparatus for and method of producing semiconductor devices, and more particularly, to a method and apparatus for producing semiconductor devices which is provided with a mold and a lead frame suitable for improving the production efficiency and product quality.

As disclosed in Japanese Patent Pre-examination Publication No. 61-292330 and Japanese Utility Model Pre-examination Publication No. 62-157143, a conventional apparatus includes a plurality of pots which communicate with each other via auxiliary runners are provided in a mold, and one product cavity is connected to a tip of each of a pair or two pairs of main runners which are connected to pots. In addition, as disclosed in Japanese Patent Pre-examination Publication No. 62-122136, another conventional apparatus is so constructed that a plurality of product cavities are connected in series to the respective tips of the runners.

In the prior art disclosed in Japanese Patent Pre-examination Publication No. 61-29230 and Japanese Utility Model Pre-examination Publication No. 62-157143, even if the amounts of tablets charged into pots through flow paths between pots vary, the apparatus has the effect of being capable of making uniform the internal pressure of the flow passages between the pots. However, only one cavity is provided at the tip of each runner, and an excessive amount of resin is required for filling the flow passages, so that there have been limitations to improving the yield.

In the other prior art referred to above, the apparatus is so constructed that a plurality of cavities are connected in series to each runner, respectively independently, led from a plurality of pots. However, since the weights of tablets charged into each pot usually vary, there have been limitations to uniformalizing the internal pressures in the flow passages between the pots.

In other words, in the prior art, no consideration has been paid to making effective use of the resin and uniformalizing the internal pressures in the flow passages between the pots in the mold.

SUMMARY OF THE INVENTION

Accordingly, it is a primary object of the present invention to provide a semiconductor producing apparatus which is capable of making compatible the production efficiency and the improvement in product quality.

A second object of the present invention is to provide a method of producing a semiconductor device by using the semiconductor producing apparatus.

A third object of the present invention is to provide a lead frame which is suitable for use with the semiconductor producing apparatus and yields a high level of production efficiency.

To attain the first object of the invention, according to one aspect of the invention, there is provided an apparatus for producing semiconductor devices, comprising a mold including a plurality of pots for supplying molding resin, a flow passage for allowing the pots to communicate with each other, and a plurality of cavities in which semiconductor devices are to be respectively placed and which are arranged in series.

According to another aspect of the invention, the second object of the invention is attained by providing a method of producing semiconductor devices using an apparatus for producing semiconductor devices, the method comprising the steps of: placing a lead frame in the mold; pouring the resin into the pots; and pressing the resin accommodated in pots with a plurality of plungers so as to inject the resin into the cavities.

Furthermore, according to a still another aspect of the invention, the third object of the invention is attained by providing a lead frame, wherein a plurality of pedestals for mounting the semiconductor devices respectively thereon are arranged on the lead frame in the longitudinal and widthwise directions thereof.

In addition, according to the present invention, modifications are provided in which a slit is provided between semiconductor devices in a lead frame, or a bridge is provided in a part of the slit.

In accordance with the present invention, a decline in the yield of resin material as a result of providing the flow passage between pots is offset by increasing the number of cavities in series, and, on the contrary, a substantial improvement can be made in the yield of the resin material. In addition, even if the weights of the resin charged into each pot vary substantially, it is possible to uniformalize the molding pressure applied to each pot as the resin is transferred through the flow passage between the pots. Furthermore, the lead frame is arranged such that semiconductor devices to be encapsulated are arranged in the longitudinal and widthwise directions of the lead frame. Therefore, as compared with a conventional lead frame in which semiconductor devices are arranged only in one direction, the production cost per product can be reduced substantially. Moreover, since the pitches between the semiconductor devices can be made very small, the flow passage can be made short, which entails such advantages as stable molding thanks to a reduction in the fluid resistance during molding, and an increase in the number of semiconductor devices per unit area of the mold, thereby further improving the production efficiency. Meanwhile, since the cylinder rod can be connected directly to each plunger of the molding press, it is possible to effect accurate control of the operation of the plungers from the molding press side, leading to a substantial improvement in the product quality.

The other objects, features and advantages of the present invention will become more apparent from the following description of the invention when read in conjunction with the accompanying drawings.

DESCRIPTION OF THE PREFERRED EMBODIMENTS

Referring now to the accompanying drawings, description will be made of the preferred embodiments of the present invention.

Figure 1A:
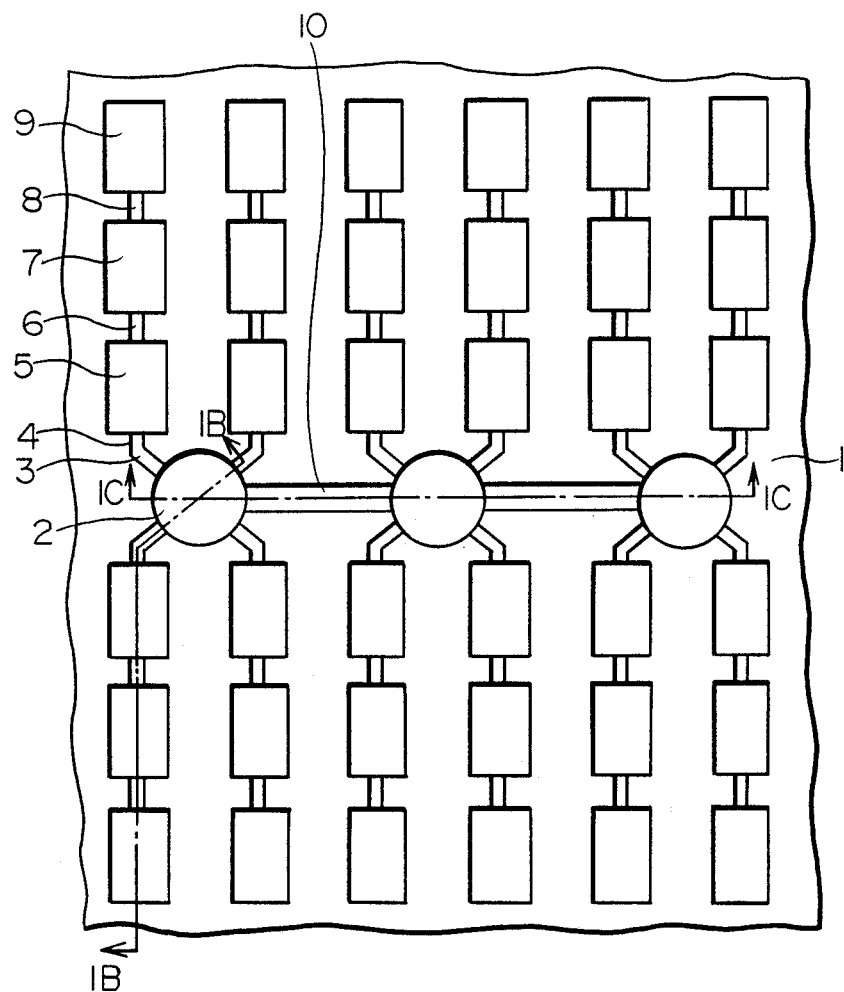
FIG. 1A is a top plan view of a lower die of a mold in accordance with a first embodiment of the present invention.
Figure 1B:
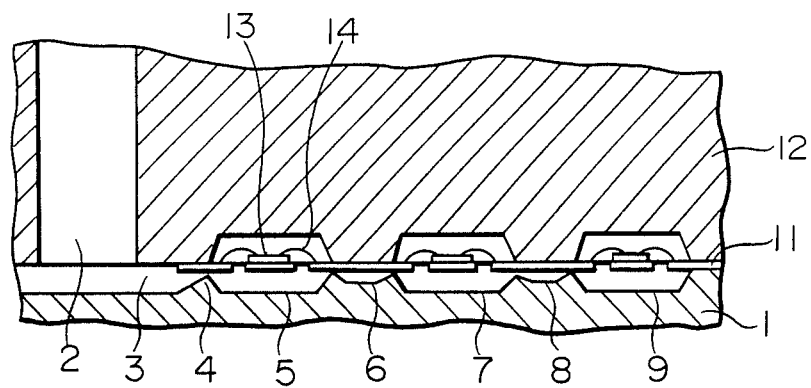
FIG. 1B is a fragmentary cross-sectional view taken along the line IB—IB in FIG. 1A with the upper and lower dies closed.
Figure 1C:
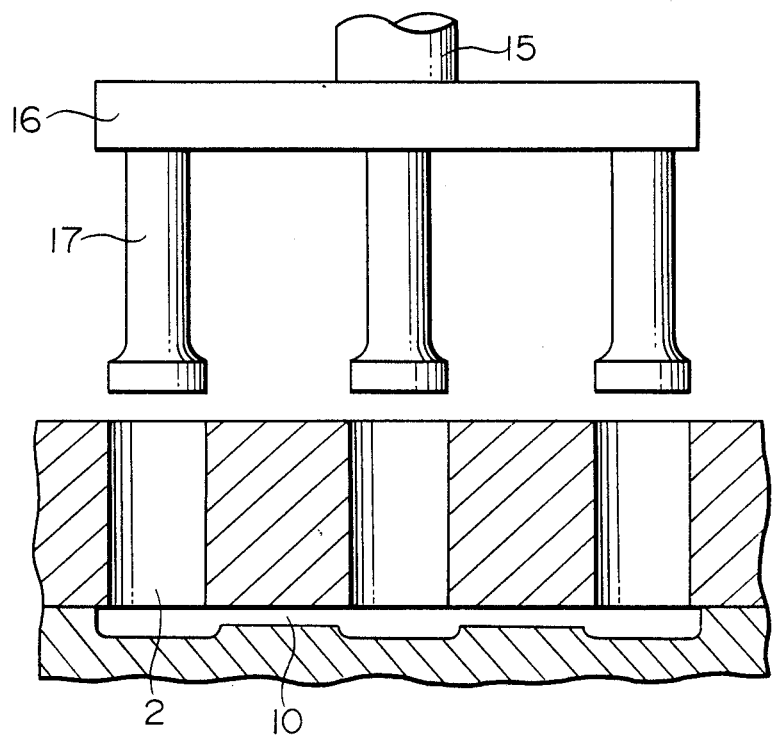
FIG. 1C is a cross-sectional view taken along the line IC—IC in FIG. 1A.

First, FIGS. 1A to 1C illustrate an arrangement of an apparatus in accordance with an embodiment of the present invention, wherein lower die 1 of the mold includes a plurality of pots 2 (three pots are shown in FIG. 1A) for feeding encapsulating resin, with a runner 3 being provided for each pot 2. A first gate 4 is provided at a tip of each runner 3, and a first cavity 5 is provided in communication with this first gate 4. A second gate 6 is provided downstream of the first cavity 5 as viewed in the direction of the supply of resin and a second cavity 7 is provided and connected to this second gate 6. Furthermore, a third cavity 9 is connected to the downstream side of the second cavity 7 via a third gate 8. In other words, three cavities are arranged in series. In addition, the pots 2 communicate with each other through a communication passage 10.

As shown in FIG. 1B a lead frame 11 is interposed between an upper die 12 and the lower die 1. Chips 13 are mounted on the lead frame 11 at position corresponding to the first cavity 5, the second cavity 7 and the third cavity 9. Each of the chips 13 and the lead frame 11 are connected to each other by metal wires 14, thereby constituting electrical components to be encapsulated with resin.

In FIG. 1C, the upper die 12 and the lower die 1 as closed and plungers 17 are connected to a rod 15 via a rigid connecting plate 16.

Resin (not shown) is charged into each pot shown in FIGS. 1A to 1C and, then, the rod 15 of the molding press is lowered so that the plungers 17 are lowered through the pots 2 by the rigid connecting plate 16. The plungers 17 force the resin into the passage 10 between the pots 2 and each of the runners 3 so that each gate and cavity provided downstream of each of the runners 3 are filled with the resin.

Figure 2:
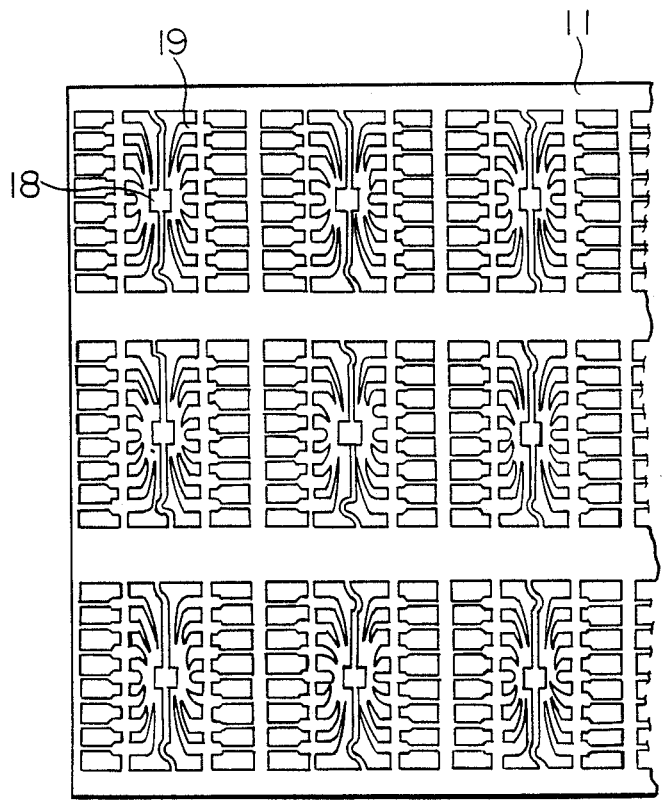
FIG. 2 is a front elevational view of a lead frame used in the mold shown in FIG. 1.

In FIG. 2, chips (not shown) are die-bonded to pedestals 18 and then wire-bonded to tip portions of inner leads 19 by metal wires (not shown) to form semiconductor components. Thus, semiconductor components are arranged on the lead frame in the longitudinal and widthwise directions thereof.

Figure 3:
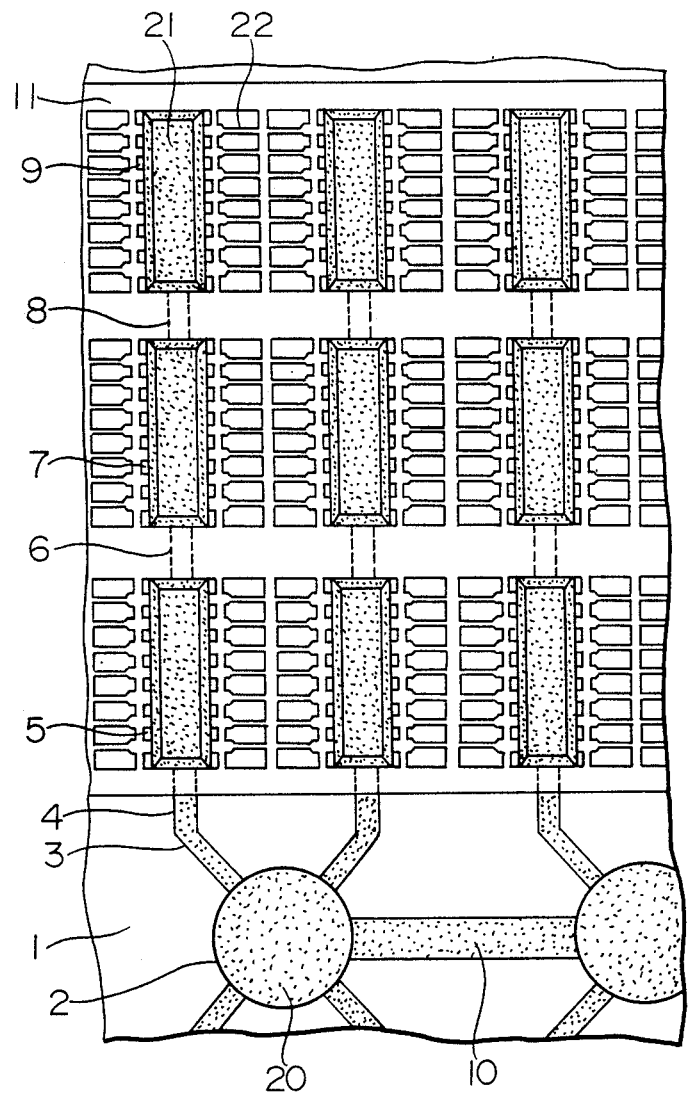
FIG. 3 is a top plan view of the lower die after a semiconductor device is encapsulated with resin by using the mold shown in FIG. 1 and the lead frame shown in FIG. 2.

In FIG. 3, the lower die 1 is in a position in which a pressure feeding of a resin 20 has been completed with the lead frame 11 shown in FIG. 2 interposed between the lower die 1 shown in FIG. 1A and the upper die 12. The resin 20 hardens after a lapse of a predetermined time period, so that resin encapsulated products 21 are obtained. Subsequently, resin encapsulated semiconductor device components are obtained after undergoing a predetermined process. Incidentally, in this embodiment, the resin inside each cavity flows continuously in a perpendicular direction with respect to a pattern of outer leads 22 constituting outer lead pins of each resin encapsulated semiconductor device component.

In the embodiment illustrated in FIGS. 1A-1C, 2 and 3, the plungers 17 are disposed on the upper side of the pots 2. However, in case where the plungers 17 are disposed below the pots 2, it is also possible to obtain resin encapsulated semiconductor devices with equivalent productivity and product quality.

Figure 4:
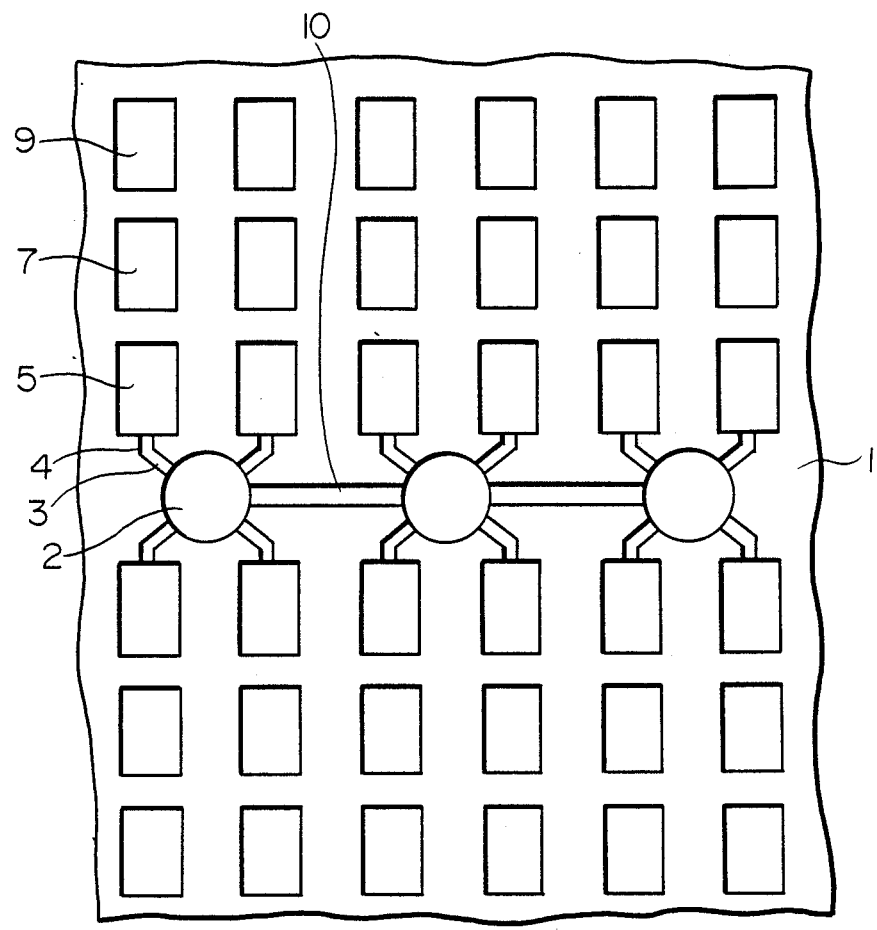
FIG. 4 is a top plan view of the lower mold in accordance with a second embodiment of the present invention.

The difference between the arrangements shown in FIG. 4 and FIG. 1A lies in that, in the arrangement in FIG. 4, the second and third gates are not provided in the lower die 1 and the second and third cavities 7 and 9 are provided independently. In the lead frame 11 used for the mold shown in FIG. 4, however, slits 23 for transferring the resin downstream of the second cavity 7 and the third cavity 9 are formed at positions corresponding to the second and third gates, as shown in FIG. 5.

Figure 5:
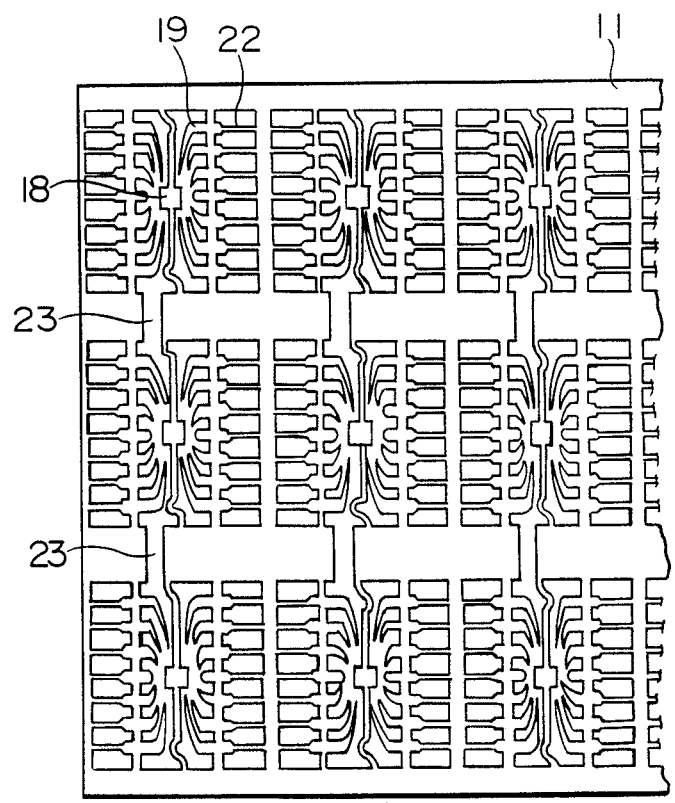
FIG. 5 is a top plan view of a lead frame used in the mold shown in FIG. 4.
Figure 6:
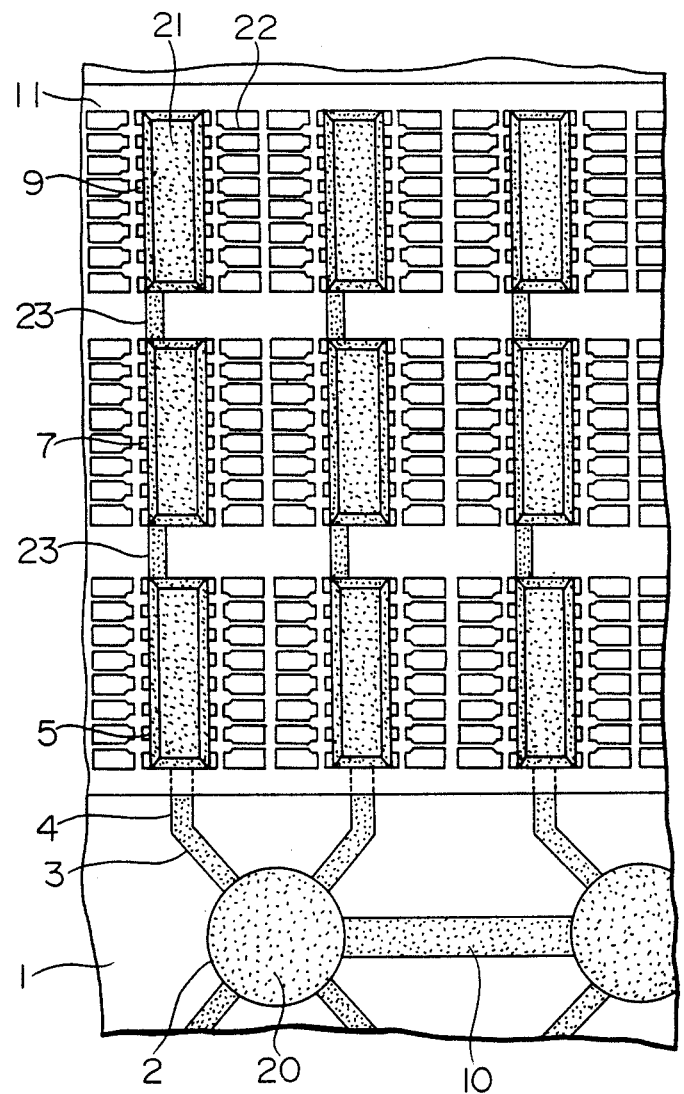
FIG. 6 is a top plan view of the lower mold after it is filled with the resin by using resin encapsulated semiconductor devices in accordance with the second embodiment.

In FIG. 6, the lower die 1 in a position in which a pressure feeding of the resin 20 has been completed with the lead frame 11 shown in FIG. 5 interposed between the lower die 1 shown in FIG. 4 and an upper die (not shown). After variations in the weight of the resin 20 are adjusted by the passage 10 between pots 2, the resin 20 flows through the runners 3 and the first gates 4 from the pots 2 and fills the first cavities 5 and then passes through the slits 23 into the second cavities 7 and further into the third cavities 9 through the slits 23, whereby the resin encapsulated products 21 are produced. Subsequently, resin encapsulated semiconductor devices are completed after undergoing a predetermined process.

In this embodiment, the costs for machining the gates can advantageously be reduced as compared with the first embodiment.

Figure 7:
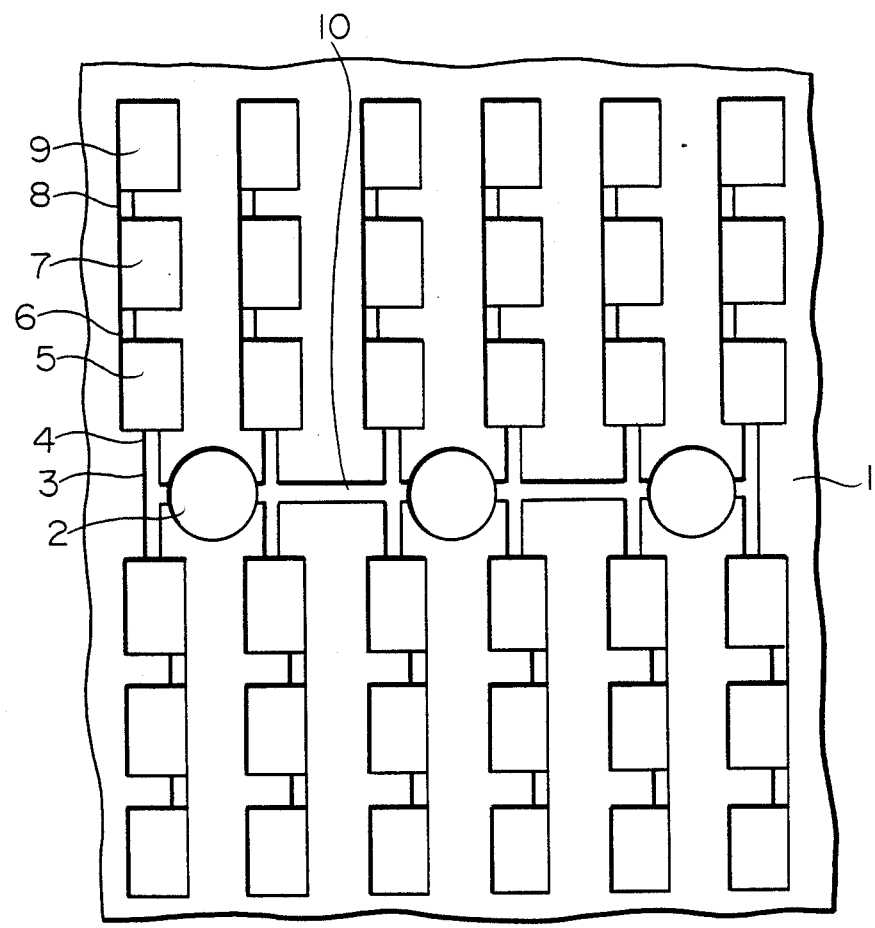
FIG. 7 is top plan view of the lower die in accordance with a third embodiment of the present invention.

The difference between the arrangements shown in FIG. 7 and FIG. 1A lies in that, in the arrangement shown in FIG. 7, the runners 3 do not directly branch off from the pots 2 but from the pot communication passage 10 and is linearly connected to the first gates 4. This arrangement facilitates an easy machining of the mold and, therefore, the production cost can be reduced.

Figure 8:
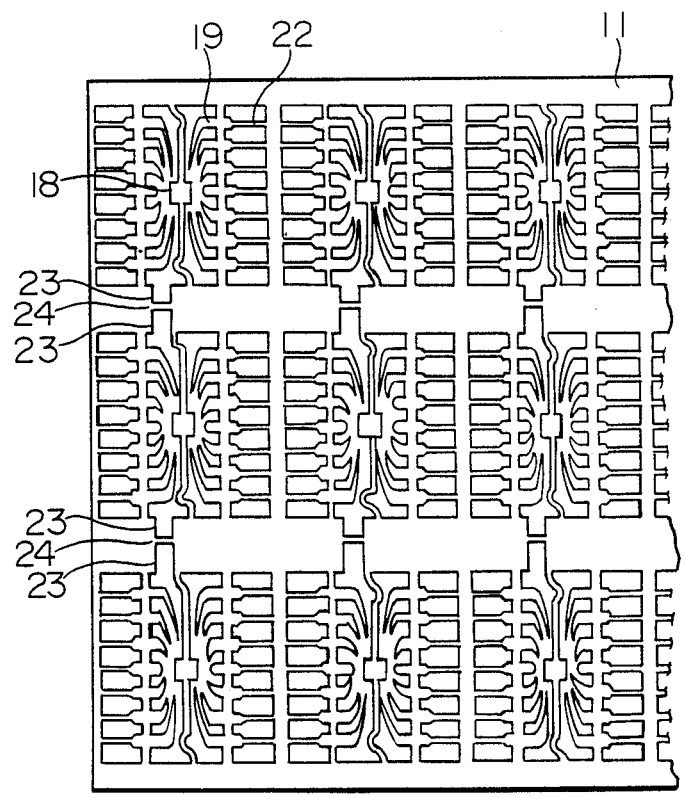
FIG. 8 is a top plan view of the lead frame used in the mold shown in FIG. 7.

The difference between the lead frame shown in FIG. 8 and that shown in FIG. 5 lies in that, in the lead frame of FIG. 8, a bridge 24 is provided in each slit 23. This makes it possible to prevent the lead frame 11 from being deformed as a result of the slit 2 being expanded by the fluid pressure of the resin during molding. Incidentally, as shown in FIG. 7, gates are respectively provided between adjacent cavities of the mold, so that the resin can flow in the downstream direction even if the bridges 24 are present in the lead frame.

Figure 9:
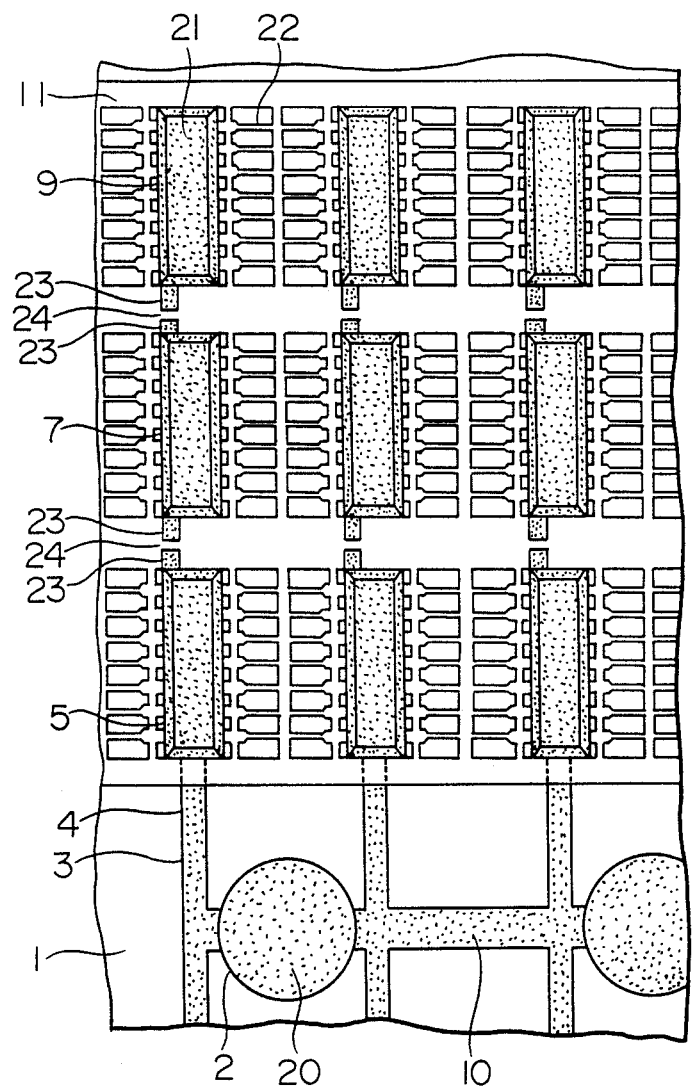
FIG. 9 is a top plan view of the lower die after it is filled with the resin by using the resin encapsulated semiconductor devices in accordance with the third embodiment.

In FIG. 9, the lower die 1 in a position in which a pressure feeding of the resin has been completed with the lead frame 11 shown in FIG. 8 interposed between the lower die 1 shown in FIG. 7 and an upper die (not shown). After variations in the weight of the resin 20 are adjusted by the pot communication passage 10, the resin 20 flows from the passage 10, and then passes through the runners 3 and the first gates 4 and fills the first cavities 5. Further, the resin 20 passes through the slits 23 and the second gates 6 (not shown) downstream thereof and is then supplied into the second cavities 7 and further into the third cavities 9 after passing through the slits 23 and the third gates 8 (not shown) downstream thereof, thereby to provide resin encapsulated products 21. In this embodiment, both the slits 23 and each gate can form flow passages, so that the resistance to the flow of the resin can be reduced. Furthermore, the deformation of the lead frame 21 at the portions of the slits 23 can be prevented by virtue of the bridges 24.

Figure 10:
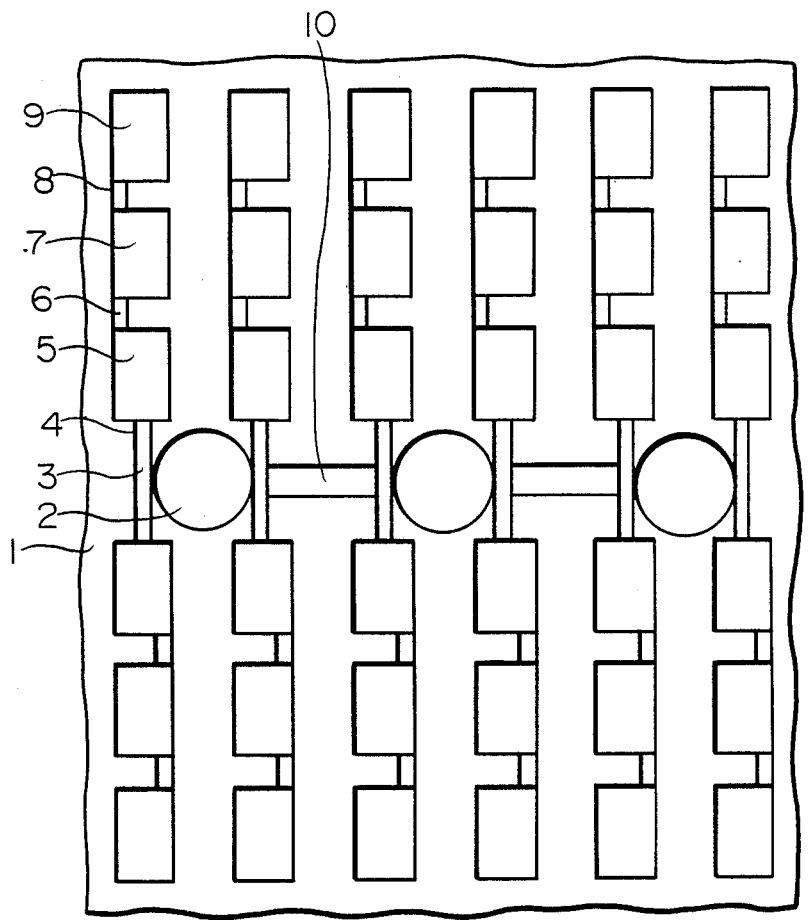
FIG. 10 is a top plan view of the lower die in accordance with the third embodiment.

In addition, the arrangement with respect of the cavity intervals, pot intervals and the pot diameters may be such that the runners 3 directly communicate with the pots, as shown in FIG. 10.

Incidentally, the lead frames shown in FIGS. 2, 5 and 19 (to be discussed later) are also applicable to the molds shown in FIGS. 7 and 10.

Figure 11:
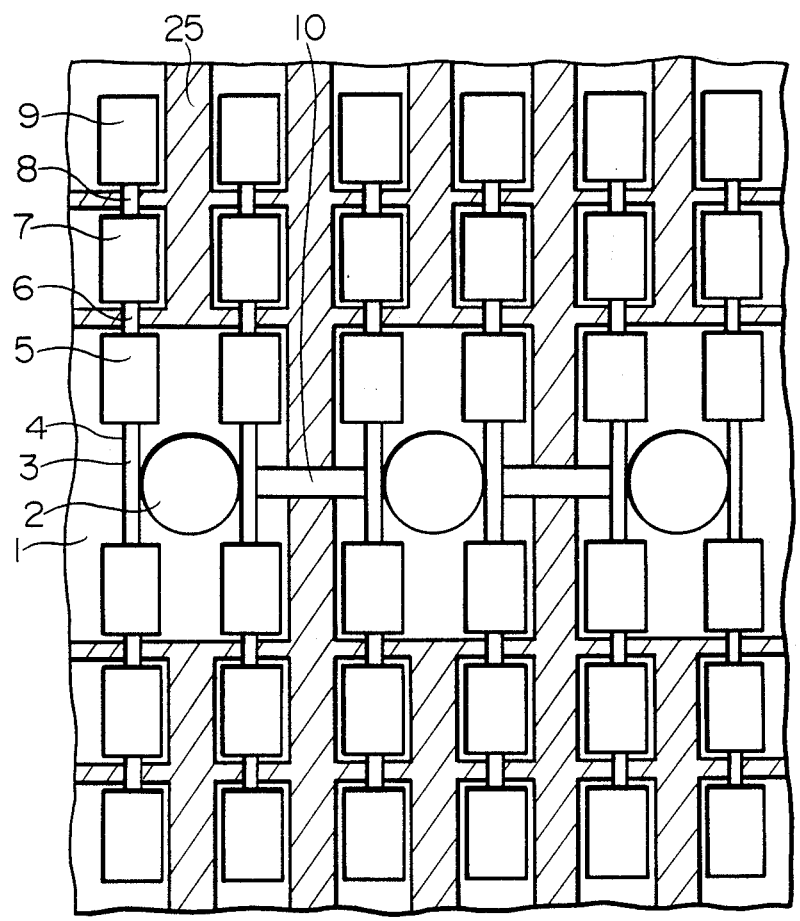
FIG. 11 is a top plan view of the lower mold in accordance with a fourth embodiment of the present invention.

The difference between the arrangements shown in FIG. 11 and the arrangements shown in FIGS. 7 and 10 lies in that air vents (a hatched portions in FIG. 11) 25 which communicate with the port communication passage 10, the second gates 6 and the third gates 8 and communicate with the outside of the mold are provided. The air vents 25 have a depth of approximately 10 $\mu$–40 82 , while the depths of the flow passage 10 and the runner 3 are about several millimeters. This arrangement affords an advantage that air which is contained in the resin when flows of the resin collide against each other at portions of the pot communication passage 10 between the adjacent pots as well as the air which is trapped in the resin when it passes through the gates are discharged outside the mold.

It is also possible to provide air vents connected with the pot communication passage and the gates in a mold having the configuration shown in FIG. 1A or FIG. 4.

Figure 12:
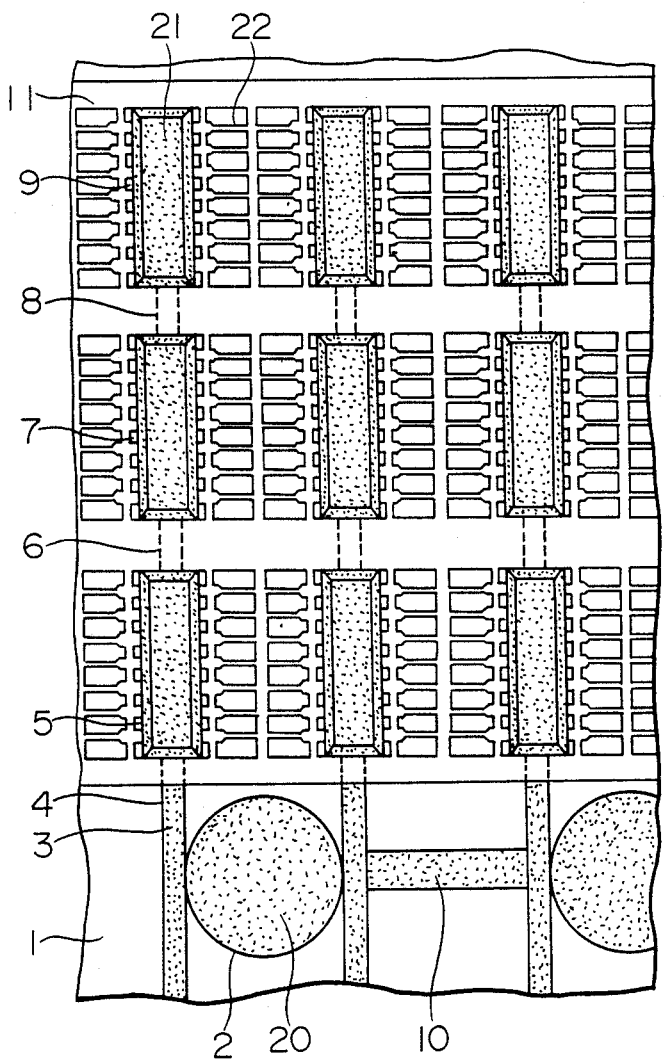
FIG. 12 is a top plan view of the lower die after it is filled with the resin by using the resin encapsulated semiconductor devices in accordance with the fourth embodiment of the present invention.

In FIG. 12, the lower die 1 is in a position in which a pressure feeding of the resin has been completed with the lead frame shown in FIG. 2 interposed between the lower die 1 shown in FIG. 11 and an upper die (not shown). This system assures that the occurrence of voids in the molded products 21 can be reduced substantially and the product quality can be improved.

If the die shown in FIG. 11 is modified such that the second and third gates 6 and 8 of the die shown in FIG. 11 are disposed as in the embodiment shown in FIG. 10, the lead frame shown in FIG. 2, 5, 8 or 11 can be used with such a modified die.

Figure 13:
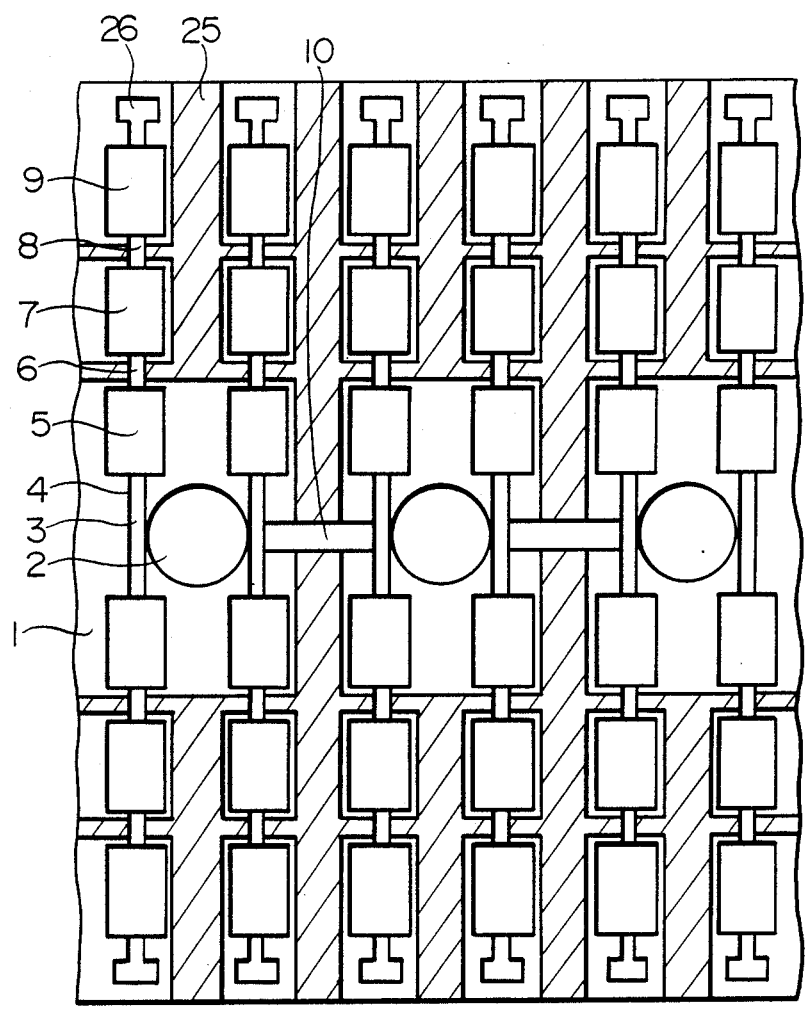
FIG. 13 is a top plan view of the lower die in accordance with a fifth embodiment.
Figure 14:
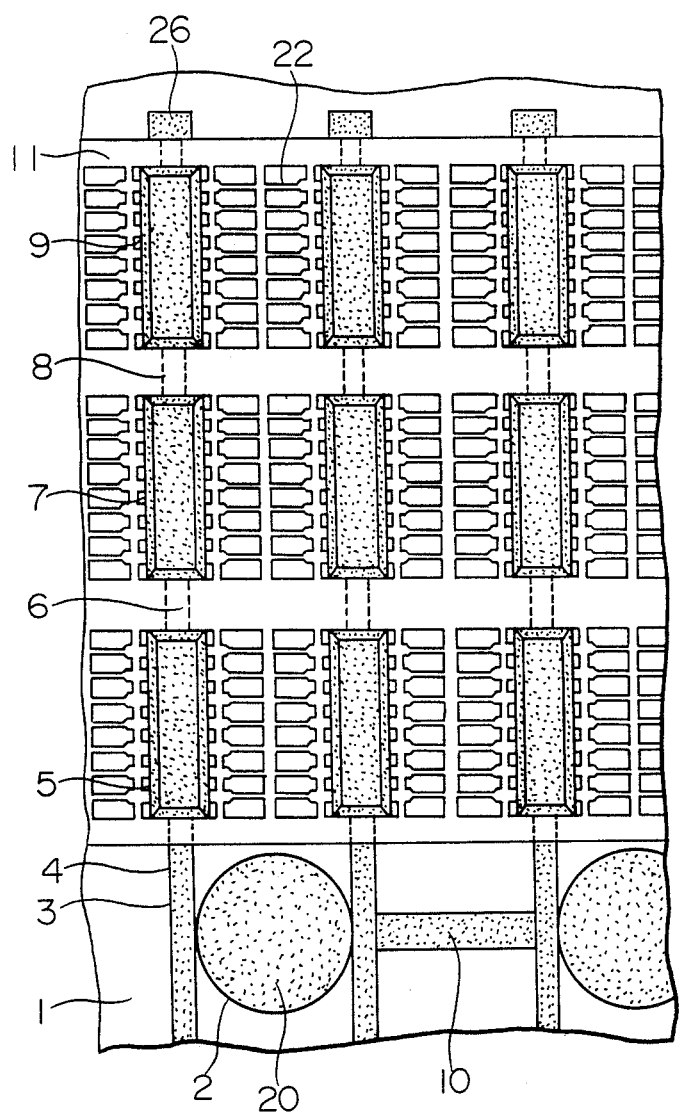
FIG. 14 is a top plan view of the lower die after it is filled with the resin by using the resin encapsulated semiconductor devices in accordance with the fifth embodiment.

FIG. 13 shows an arrangement which is distinguished from that shown in FIG. 11 in that, in addition to the afore-mentioned air vents 25, dummy cavities 26, not operative to mold semiconductor devices, are provided in communication with the third cavities, respectively, so that air entrapped in the front part of the flow of the resin can be discharged into the dummy cavities 26 to reduce the occurrence of voids in the products thereby improving the quality of the products.

It is also possible to provide dummy cavity in the molds having the configurations shown in FIG. 1A and FIG. 4.

It is apparent that, in the case of the mold shown in FIG. 13, it is possible to use a lead frame such as shown in FIG. 2, 5, 8 or 11 if the gates are disposed as shown in FIG. 10.

Figure 15:
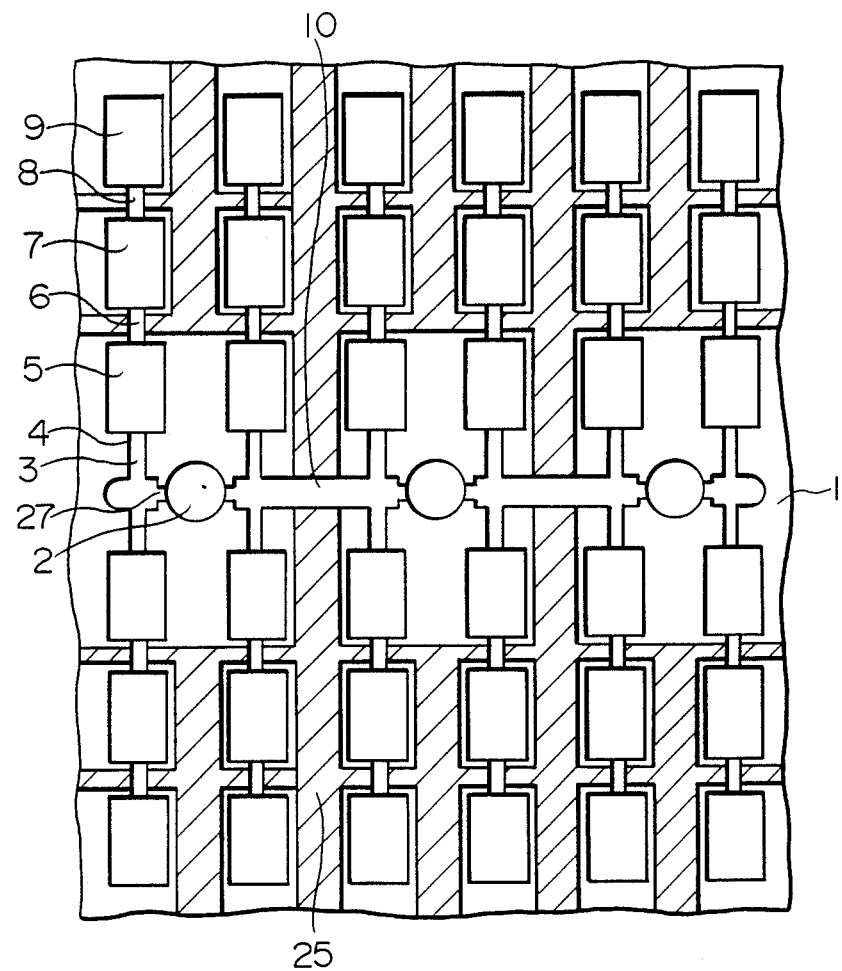
FIG. 15 is a top plan view of the lower die in accordance with a sixth embodiment of the present invention.
Figure 16:
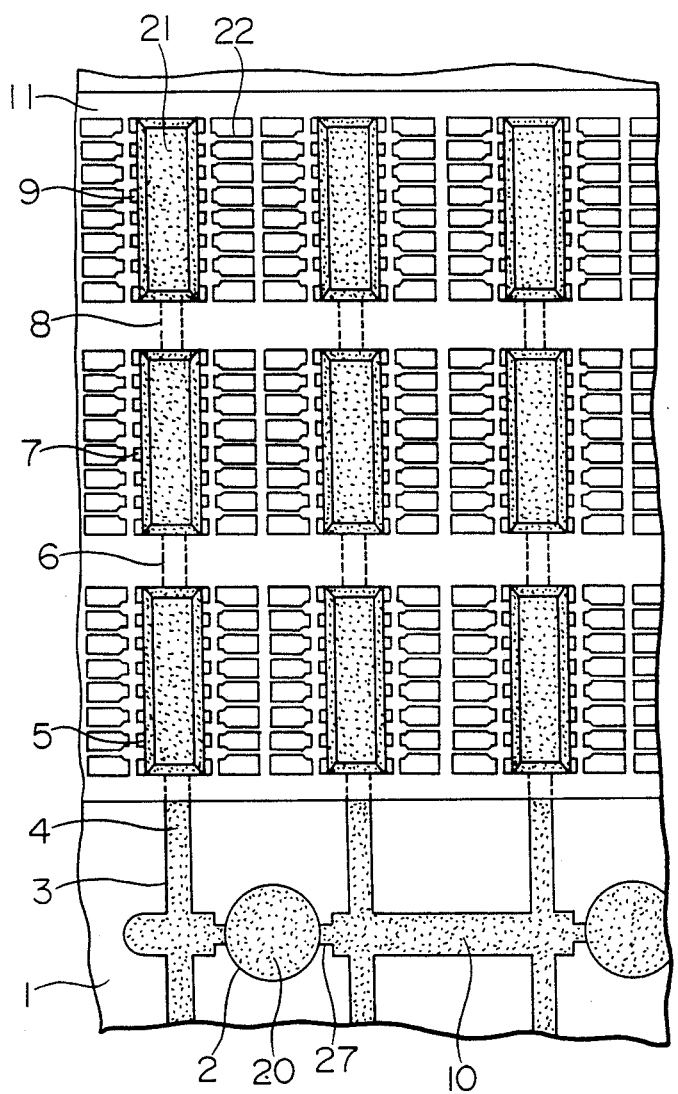
FIG. 16 is top plan view of the lower die after it is filled with the resin by using the resin encapsulated semiconductor devices in accordance with the sixth embodiment.

The difference between the arrangements shown in FIG. 15 and FIG. 11 lies in that, in the arrangement shown in FIG. 15, the resin flowing out of each pot 2 passes through resin discharge gates 27 each having sectional area narrower than that of the pot communication passage 10 and is then led to the passage 10 and the runners 3. As a result, it is possible to compress the voids contained in the resin and to thereby reduce the sizes of the voids flowing into the cavities. As described before, moreover, the air contained in the resin is discharged outside the mold through the air vents 25. Consequently, it is possible to reduce the voids in the molded products.

It is apparent that, with the mold shown in FIG. 15, it is also possible to use the lead frame shown in FIG. 2, 3, 8 or 11 if the gates are arranged in the manner shown in FIG. 10.

Figure 17:
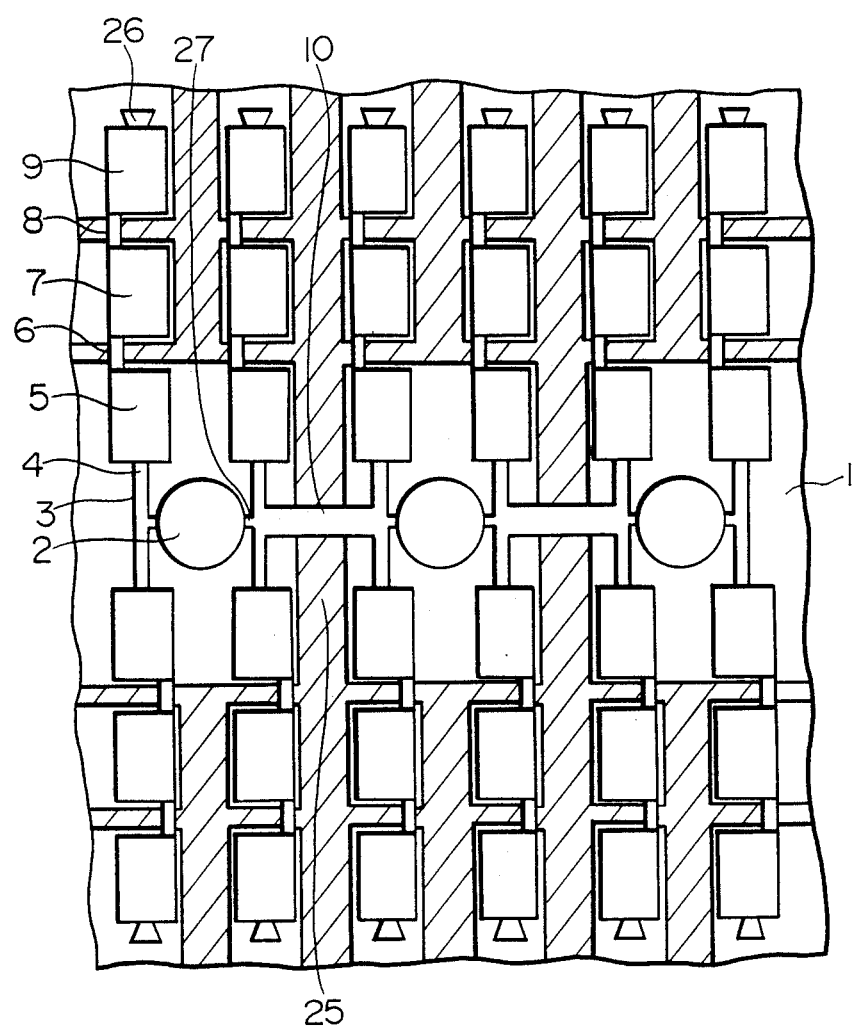
FIG. 17 is a top plan view of the lower die in accordance with a seventh embodiment of the present invention.
Figure 18:
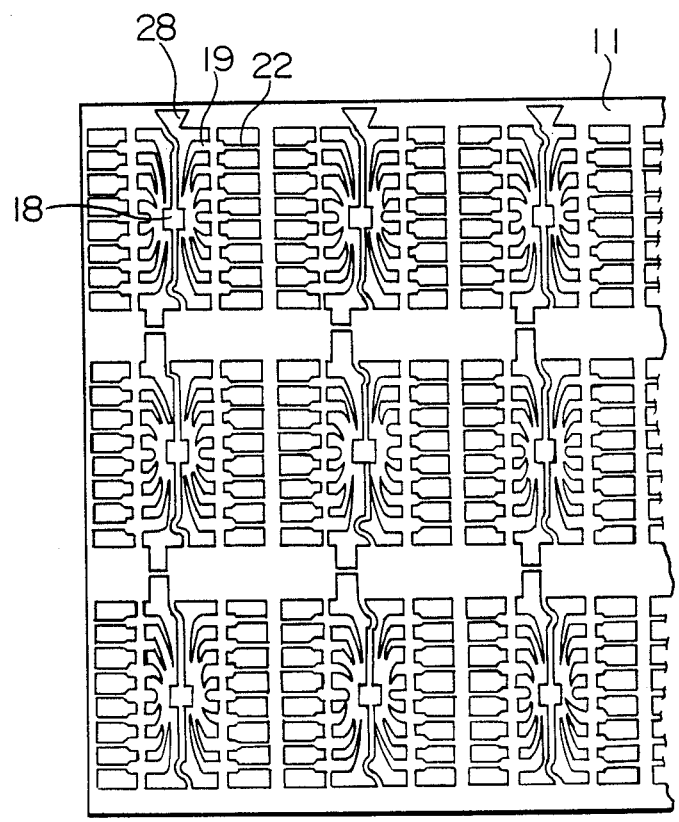
FIG. 18 is a front elevational view of the lead frame used in the mold shown in FIG. 17.

The difference between the arrangements shown in FIG. 17 and FIG. 15 lies in that, in the arrangement of FIG. 17, gates 27 for resin discharge from the pots 2 are provided and dummy cavities 26 are provided in communication with the third cavities 9, respectively, so that the air contained in the resin which has flowed through the cavities can be trapped in the dummy cavities 26. Consequently, the voids in the molded products can be reduced.

Figure 19:
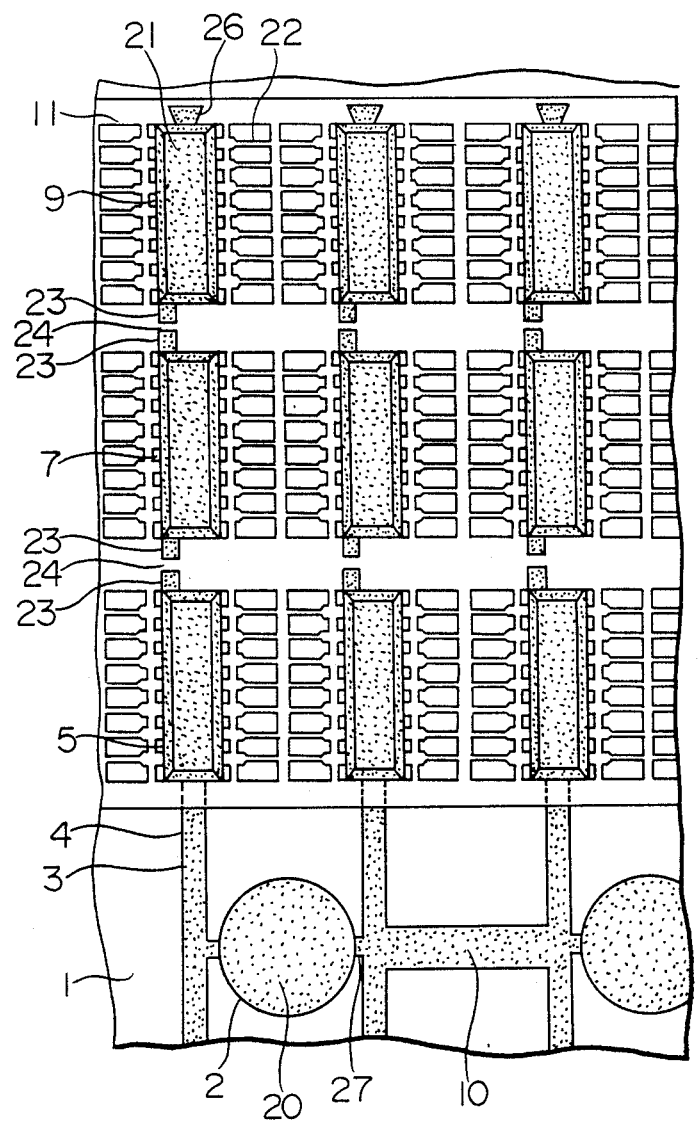
FIG. 19 is a top plan view of the lower die after it is filled with the resin by using the resin encapsulated semiconductor devices in accordance with the seventh embodiment.

Furthermore, the difference between the arrangements shown in FIGS. 13 and 14 and FIGS. 17 and 19 lies in that, in the embodiment shown in FIGS. 17 and 19, dummy cavities 26 are provided in the lower die at locations that are covered by the lead frame 1 and resin discharge slits 28 are provided in the lead frame 11 at positions corresponding to the dummy cavities 26. Hence, there is an advantage that the pots 2, the runners 3, the first gates 4, the second gates 6, the third gates 8 and the dummy cavities 26 and 28, all of which are not used after molding, can be simultaneously and simply stamped out and removed. Accordingly, this arrangement facilitates an automation of the production process and substantially improves the productivity.

Figure 20:
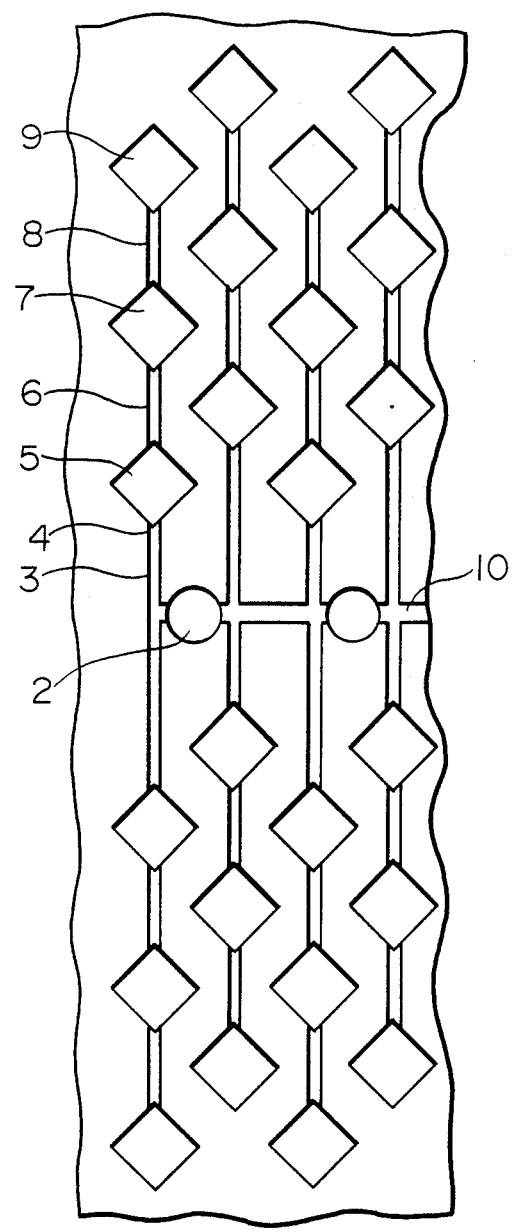
FIG. 20 is a top plan view of the lower die in accordance with an eighth embodiment of the present invention.

The arrangement of the pot communication passage 10 and the manner in which the runners 3 are branched off as shown in FIG. 20 are the same as those shown in FIG. 7, but the arrangement shown in FIG. 20 is different from that shown in FIG. 7 in that the cavities are disposed diagonally relative to the runners and the resin flows from an apex of one cavity to an apex of an adjacent cavity and that two types of runners, i.e., longer and shorter types, are employed and arranged such that a longer runner is positioned adjacent to a shorter runner.

Figure 21:
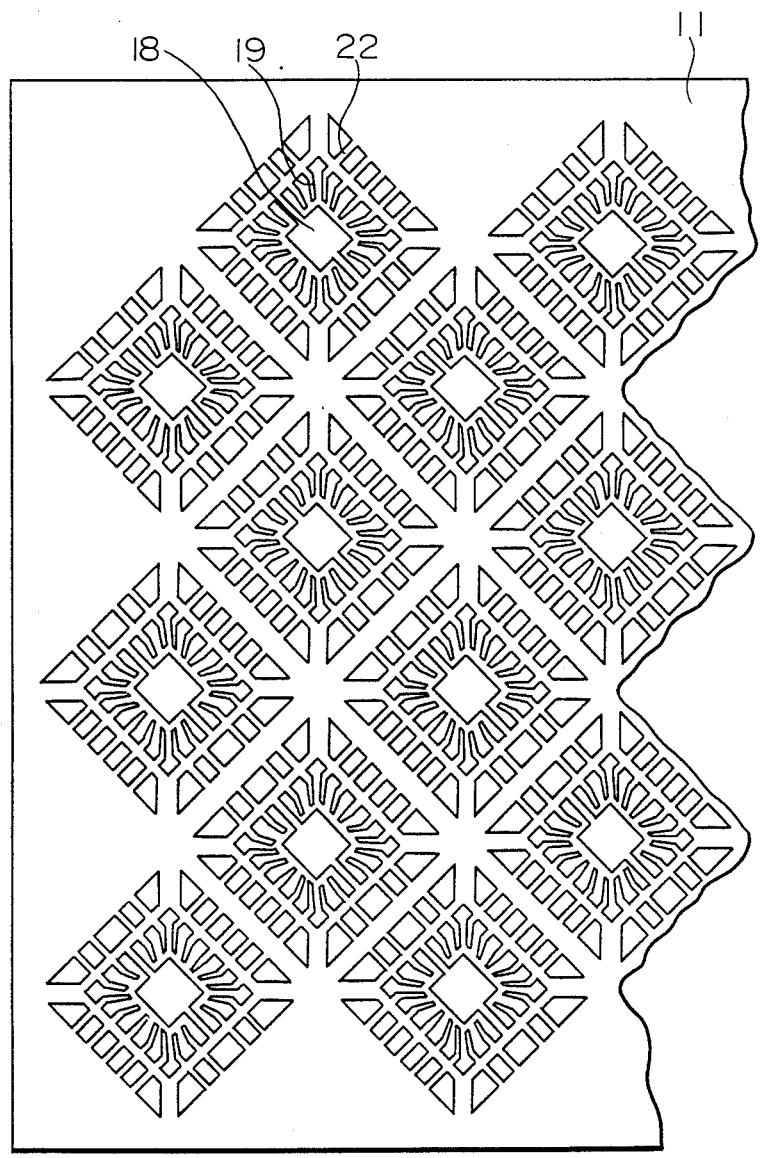
FIG. 21 is a front elevational view of the lead frame used in the mold shown in FIG. 20.

The lead frame shown in FIG. 21 is of a type in which the outer leads 22 extend in four directions other than in two directions as shown in FIGS. 2, 5, 8 and 18. Furthermore, the outer leads 22 shown in FIGS. 2, 5, 8 and 18 are disposed parallel to one side of the outer frame of the lead frame, whereas the outer leads 22 shown in FIG. 21 are disposed at a certain angle to any sides of the outer frame of the lead frame.

Figure 22:
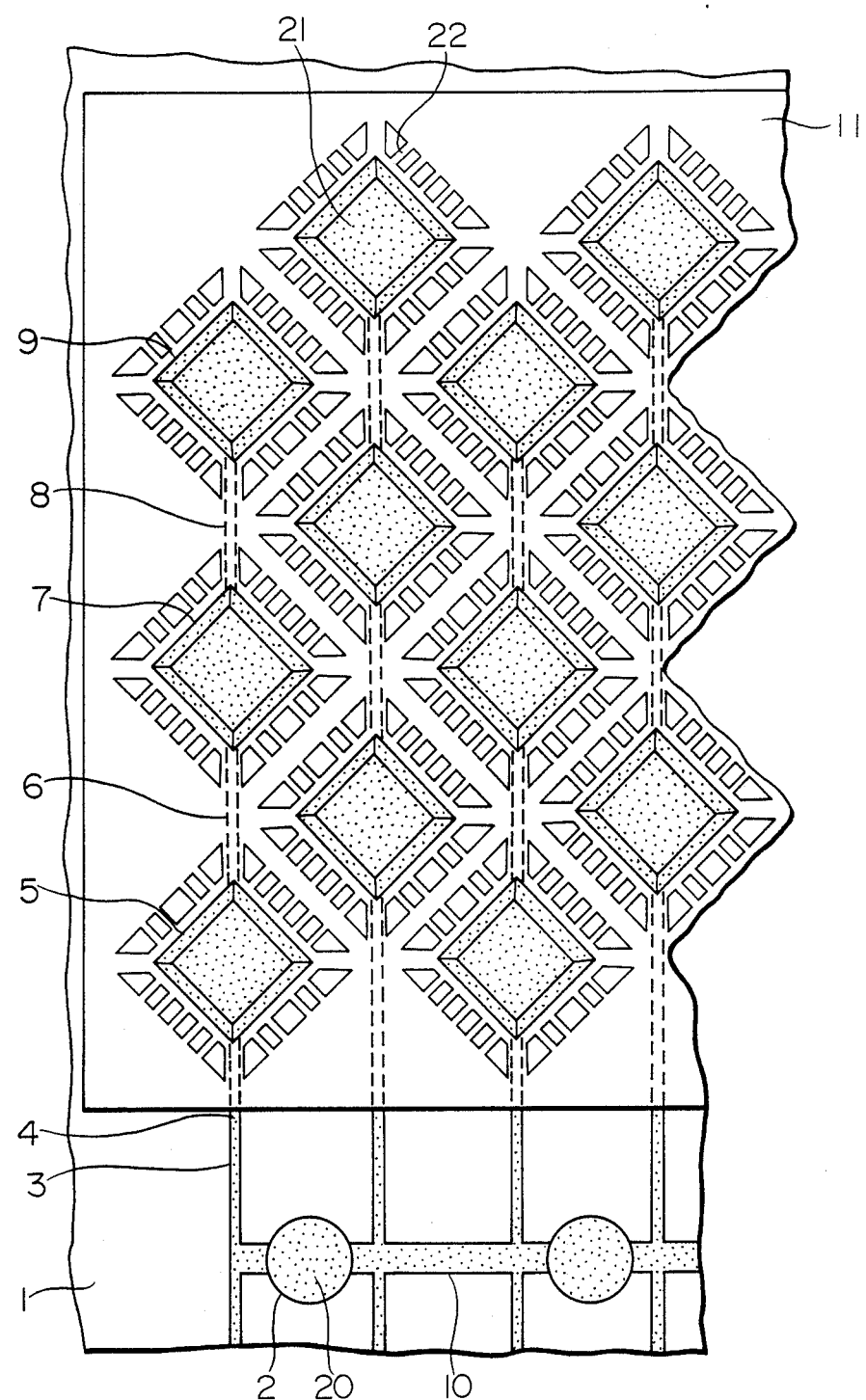
FIG. 22 is a top plan view of the lower die after it is filled with the resin by using the resin encapsulated semiconductor devices in accordance with the eighth embodiment.

In FIG. 22 is a top plan view of the lower die 1 is in a position in which a pressure feeding of the resin has been completed with the lead frame 11 shown in FIG. 21 interposed between the lower die 1 shown in FIG. 20 and an upper die (not shown). By using this embodiment, it is possible to produce, with a high level of production efficiency, semiconductor devices each having outer leads 22 projecting in four directions. Moreover, the lead frame is arranged in the mold in such a manner that the resin flows in a direction inclined by a predetermined angle with respect to a pattern of outer leads provided in the lead frame.

In this embodiment, although an example in which one structure of the mold and one structure of the lead frame are combined is illustrated, other various combinations can be employed as in the first to the seventh embodiments.

In the above-described embodiment, moreover, three cavities are arranged in series to obtain three products by using one runner. This, however, is only illustrative and the number of products to be obtained may be determined appropriately based on the sizes of the products, the flowability of the resin, etc.

Figure 23:
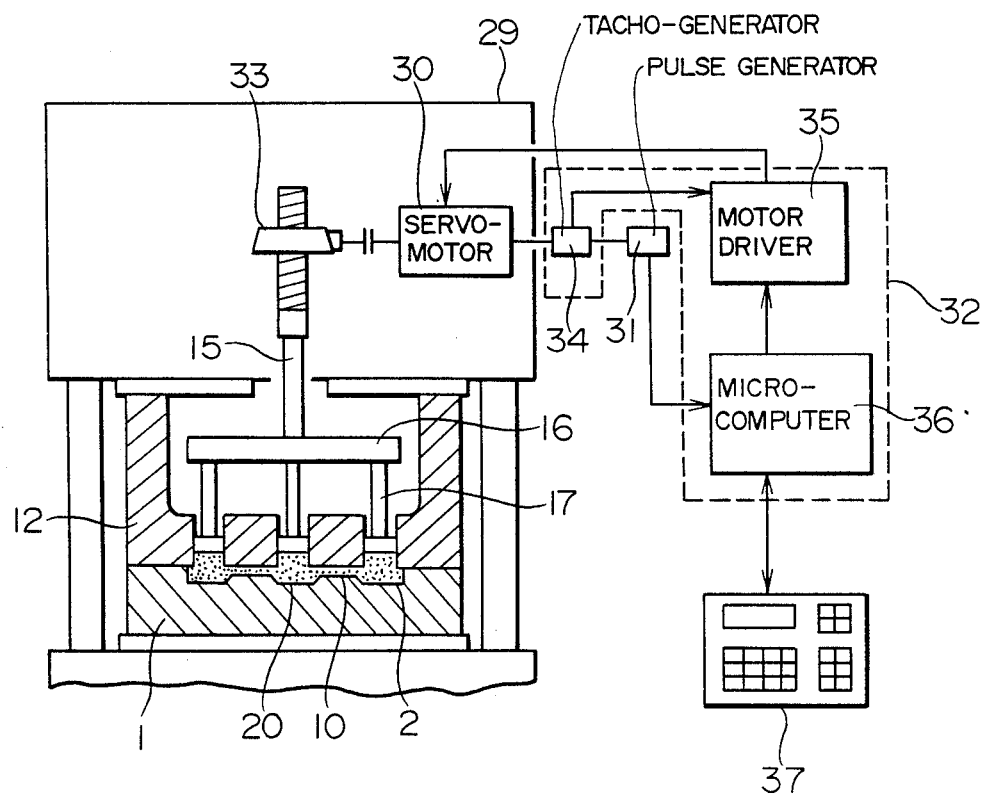
FIG. 23 is a diagrammatic illustration of the overall arrangement of an apparatus for producing resin encapsulated semiconductor devices in accordance with a ninth embodiment of the present invention.

FIG. 23 is a schematic diagram of an arrangement of an overall apparatus for producing resin encapsulated semiconductor devices in accordance with the present invention with an upper die 12 and the lower die 1 closed, as shown in FIG. 1B, and with the mold mounted on a molding press 29. Each plunger 17 is secured to one side of the rigid connecting plate 16 and the rod 15 of the molding press is connected to the other side of the rigid connecting plate 16. In addition, the pots 2 communicate with each other through the pot communication passage 10.

A description will now be made of the outline of the arrangement of the apparatus for driving the rod 15. When a rod lowering switch (not shown) is turned on, the plungers 17 connected to the rod 15 via the rigid connecting plate 16 are lowered to cause the resin 20 in the pots 2 to be forced into the mold. A driving circuit is formed as an electrical circuit comprising a servomotor 30 formed by a motor, a pulse generator 31 formed by a distance recorder which is capable of detecting the traveling distance of this servomotor 30, and a drive controlling section 32. In the drive controlling section 32 primary current i max$_2$ (where i max$_1$ > i max$_2$) serving as maximum currents to be supplied to the servomotor as well as a predetermined traveling distance, are set in advance. When the plunger lowering switch is turned on, the speed of the servomotor 30 is controlled and the maximum current of the motor is set to the primary current. When the traveling distance has reached the predetermined traveling distance, the maximum current of the servo motor 30 is changed over to the secondary current, and when the motor current is thus changed over to this secondary current, the torque of the servomotor 30 is controlled. A ball screw jack 33 is provided for decelerating the rotation of the servomotor 30, converting the rotation into linear motion and transmitting the linear motion to the rod 15 to cause the rod 15 to be lowered.

More specifically, the servomotor 30 is connected to a tacho-generator 34 and the pulse generator 31. A motor driver 35 is adapted to fetch a signal representing the number of revolutions from the tachogenerator 34 and is capable of effecting a closed loop control in a speed-control region in such a manner that the number of revolutions of the servomotor 30 is adjusted to be the number of revolutions set in a microcomputer unit 36 (which will be described later in detail). The pulse generator 31 is capable of detecting the traveling distance of the servomotor 30, i.e., the plunger displacement. The microcomputer unit 36 is adapted to fetch a displacement signal from the pulse generator 31 and is capable of controlling the movement of the plungers 17. A console 37 is used to set the maximum motor currents, the number of revolutions of the servomotor 30 and the plunger displacement in the microcomputer unit 36.

Figure 24:
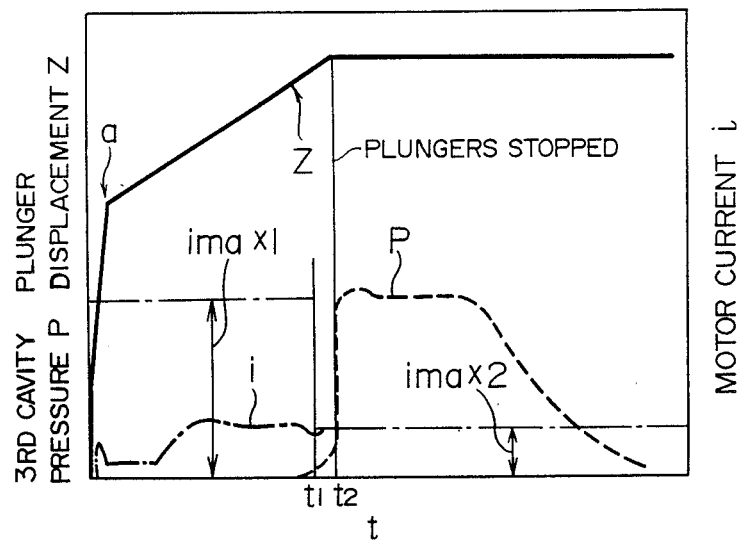
FIG. 24 is a graph illustrating a molding profile obtained by using the apparatus for producing resin encapsulated semiconductor devices in accordance with the ninth embodiment.

The operation of the molding press thus constructed will now be described with reference to FIGS. 23 and 24. This embodiment is a case in which resin having poor fluidity (i.e., a resin having high viscosity with a large amount of filler mixed in) is used.

The console 37 is operated to set, in the microcomputer unit 36, the primary current i max$_1$, the secondary current i max$_2$, a first plunger displacement d$_1$ (a displacement to a first predetermined position in which the lower ends of the plungers 17 are slightly above upper ends of resin tablets (not shown) inside the pots 2), a second plunger displacement d$_2$ (a displacement to a second predetermined position in which the lower ends of the plungers 17 are slightly below the first predetermined position given by the first plunger displacement d$_1$, i.e., at a position obtained immediately before the plungers 17 complete the filling of the resin), a first number of revolutions $N_1$, and a second number of revolutions $N_2$ (where $N_1 > N_2$)

When the resin tablets (not shown) are charged into the pots 2 and the plunger lowering switch (not shown) of the apparatus is turned on, the microcomputer unit 36 outputs a speed control command and the first number of revolutions $N_1$ to the motor driver 35 to set the maximum motor current as being the primary current i max$_1$, so that the servomotor 30 rotates at the first number of revolutions $N_1$. This rotation is transmitted by the ball screw jack 33 by which the speed is reduced and the rotation is converted into downward motions of the rod 15 and the plungers 17.

The number of revolutions of the servomotor 30 is counted by the tacho-generator 34 and a signal representing the number of revolutions from this tachogenerator 34 is fetched by the motor driver 35, which effects a closed loop control in such a manner that the rotation of the servomotor 30 is constantly set to be the aforementioned first number of revolutions $N_1$. A signal from the pulse generator 31 is fed to the microcomputer unit 36 and compared with the first plunger displacement $d_1$. The plungers 17 are lowered at a high speed inside the pots 2 in response to the first number of revolutions $N_1$ and, when the plunger displacement detected by the pulse generator 31 has become the first plunger displacement $D_1$ (point a in FIG. 24), the number of revolutions of the servomotor 30 drops from the first number of revolutions $N_1$ to the second number of revolutions $N_2$ in response to a command from the microcomputer unit 36, thereby causing the plungers 17 to be lowered at a low speed.

The molten resin 20 heated by heaters (not shown) provided in the lower die 1 and the upper die 12 fills the pot communication passage 10 and, as a result of the lowering of the plungers 17, passes through the runners 3 and the first gates 4 shown in FIGS. 1A and 1B, and is transferred consecutively to the downstream side. When a position is reached which is immediately before the filling of the resin in the most downstream third cavity 9 is finished, i.e., when the displacement of the plungers 17 has become the second plunger displacement $d_2$ ($t_1$ in FIG. 24), the microcomputer unit 36 issues a command to change over the maximum motor current from the first current i max$_1$ to the second current i max$_2$. The servomotor 30 continues its rotation at the second number of revolutions $N_2$. When all the cavities have been filled with the resin 20 and the plungers 17 have stopped ($t_2$ in FIG. 24), the motor current i is kept at the second value i max$_2$ and, the torque control is then commenced, a resin pressure P corresponding to i max$_2$ is applied to the resin 20 for a predetermined period of time to complete molding, and the power of the molding press is turned OFF.

Since this control is effected, even when resin having poor moldability is used, the plungers 17 can be lowered at the set speed up to immediately before completion of filling. In addition, since the motor torque is lowered immediately before completion of the filling, there are no problems such as the occurrence of resin flashes or deformation of inserts due to unduly high pressure otherwise being applied to the cavities.

Figure 25:
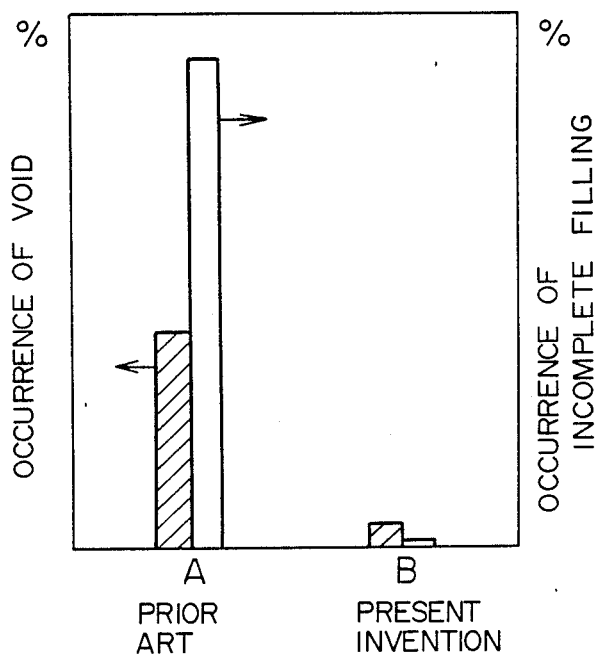
FIG. 25 is a graph showing the occurrence of faults in comparison with a conventional molding method.

FIG. 25 is a graph showing an example of the void occurrence percentage and the percentage of incomplete filling of resin in respect of resin encapsulated products formed by the mold shown in FIG. 1 and by a conventional molding press of a hydraulic open loop control system. In FIG. 25, A denotes the faults of resin encapsulated products formed by using the conventional circuit of the hydraulic open loop control system, while B denotes the faults of resin encapsulated products formed by the apparatus in accordance with the present invention. The graph shows that the percentage of faults is appreciably reduced in the case of the present invention.

Although an electrically-driven closed loop control has been described and illustrated in this embodiment, a hydraulically-driven closed loop control may be employed alternatively.

What is claimed is:

1. A method of producing semiconductor devices, said method comprising the steps of:
   providing a mold having a plurality of pots for supplying a molding resin;
   communicating said pots with each other by communication passages;
   providing groups of cavities in the mold with each group of cavities comprising a plurality of cavities arranged in series to receive the resin from one of said pots;
   placing a lead frame in said mold over said cavity;
   supplying said pots with said molding resin;
   injecting said molding resin into said cavities by pressing said resin in said pots by a plurality of plungers;
   connecting the cavities of each group of cavities with each other by passages formed by slits in the lead frame and
   feeding the resin from an associated pot through said slits into the cavities of the group.

2. A method of producing semiconductor devices, said method comprising the steps of:
   providing a mold having a plurality of pots for supplying a molding resin;
   communicating said pots with each other by communication passages;
   providing groups of cavities in the mold with each group of cavities including at least three cavities connected in series and arranged to receive resin from one of the pots whereby resin is fed from an associated pot successively into the respective cavities;
   placing a lead frame in said mold over said cavities;
   supplying said pots with said molding resin;
   injecting said molding resin into said cavities by pressing said resin in said pots by a plurality of plungers; and
   providing a dummy cavity connected to a most downstream cavity of each group for receiving excess resin therefrom.

3. A method for producing semiconductor devices, said method comprising the steps of:
   providing a mold having a plurality of pots for supplying a molding resin;
   communicating said pots with each other by communication passages;
   providing groups of cavities in the mold with each group of cavities comprising a plurality of cavities arranged in series to receive the resin from one of said pots;
   placing a lead frame in said mold over said cavity;
   supplying said pots with said molding resin;
   injecting said molding resin into said cavities by pressing said resin into said pots by a plurality of plungers;

connecting the cavities of each group of cavities with each other by runners acting as passages from an associated pot and through which passage the resin is fed from the pot into the cavities of the group of cavities; and providing air vents connected to said communication passages to allow air to escape through said air vent from the resin in said communication passages.

4. The method according to claim 3, further comprising the step of connecting the air vents to said runners for allowing air to escape through said air vents from the resin in said runners.

5. A method of producing semiconductor devices, said method comprising the steps of:

providing a mold having a plurality of pots for supplying a molding resin;

communicating said pots with each other by communication passages;

providing groups of cavities in the mold with each group of cavities comprising a plurality of cavities arranged in series to receive the resin from one of said pots;

placing a lead frame in said mold over said cavity said lead frame including a plurality of tabs arranged in longitudinal and lateral directions of said lead frame to support semiconductor devices thereon;

providing slits between semiconductor devices; and injecting said molding resin into said cavities by pressing said molding resin in said pots by a plurality of plungers through said slits with the semiconductor devices formed on said tabs.

6. The method according to claim 5, further comprising the step of forming bridges and parts of said slits when the molding resin is injected.

7. A method of producing semiconductor devices, said method comprising the steps of:

providing a mold having a plurality of pots for supplying a molding resin;

communicating said pots with each other by communication passages;

providing groups of cavities in the mold with each group of cavities comprising a plurality of cavities arranged in series to receive the resin from one of said pots;

placing a lead frame in said mold over said cavity;

supplying said pots with said molding resin;

injecting said molding resin into said cavities by pressing said resin in said pots by a plurality of plungers;

providing resin discharge slits for allowing the molding resin from downstream semiconductor devices to be discharged; and wherein the step of injecting said molding resin is effected in such a manner that the molding resin reaches and flows through the resin discharge slits.

8. A method of producing semiconductor devices, said method comprising the steps of:

providing a mold having a plurality of pots for supplying a molding resin;

communicating said pots with each other by communication passages;

providing groups of cavities in the mold with each group of cavities comprising a plurality of cavities arranged in series to receive the resin from one of said pots, said cavities being arranged such that apexes of each adjacent pair of cavities are connected by a runner; and injecting said molding resin into said cavities by pressing said resin in said pots by a plurality of plungers in such a manner that the molding resin flows through the runner.

9. A method of producing semiconductor devices, said method comprising the steps of:

providing a mold having a plurality of pots for supplying a molding resin;

communicating said pots with each other by communication passages;

providing groups of cavities in the mold with each group of cavities comprising a plurality of cavities arranged in series to receive the resin from one of said pots;

placing a lead frame in said mold over said cavity;

supplying said pots with said molding resin; and injecting said molding resin into said cavities by pressing said resin in said pot by a plurality of plungers by:

providing a plurality of plungers connected to a rod of the molding machine to a rigid plate means, downwardly driving the rod to simultaneously drive said plungers to force the molding resin out of said pots, moving said rod through a speed control to a predetermined position;

changing the speed control movement of the rod to a load control of the rod, and injecting the molding resin by operation of a driving mechanism.

10. The method of producing semiconductor devices, the method comprising the steps of:

providing a mold having a plurality of pots for supplying molding resin;

communicating said pots with each other by communication passages;

providing runners for allowing the molding resin to flow from said communication passages;

providing groups of cavities in said mold with each group comprising a plurality of cavities arranged in series to an associated runner to receive the molding resin therefrom;

placing a lead frame in said mold;

supplying said pots with said molding resin; and injecting said molding resin through said communication passages and said runners into said cavities by pressing said resin in said pots by a plurality of plungers.

11. The method according to claim 10, wherein the step of communicating includes providing gates having cross-sections smaller than cross-sections of other portions of said communication passages at positions adjacent the associated pots, and wherein the step of injecting the molding resin includes injecting the molding resin through said communication passages.

12. The method according to claim 10, wherein the step of providing groups of cavities includes providing at least three cavities in each group, and wherein the step of injecting the molding resin includes successively injecting the molding resin into said cavities.

13. The method according to claim 12, further comprising the step of providing a dummy cavity connected to a most downstream cavity of each group for receiving excess resin therefrom.

14. The method according to claim 10, further comprising the step of providing air vents connected to said communication passages to allow air to escape through said air vent from the resin in said communication passages.

15. The method according to claim 14, further comprising the step of connecting the air vents to said runners for allowing air to escape through said air vents from the resin in said runners.

16. The method according to claim 10, wherein said lead frame includes a plurality of tabs arranged in longitudinal and lateral directions of said lead frame to support semiconductor devices thereon, and wherein the step of injecting said molding resin into the respective cavities is effected with the semiconductor devices formed on said tabs.

17. The method according to claim 16, further comprising the step of providing slits between semiconductor devices, and wherein the step of injecting the molding resin includes injecting the molding resin through said slits.

18. The method according to claim 16, further comprising the step of forming bridges and parts of said slits when the molding resin is injected.

19. The method according to claim 10, further comprising the step of providing resin discharge slits for allowing the molding resin for most downstream semiconductor devices to be discharged, and wherein the step of injecting said molding resin is effected in such a manner that the molding resin reaches and flows through the resin discharge slits.

20. The method according to claim 10, wherein said lead frame is provided with outer leads formed within said lead frame, and wherein the step of placing said lead frame in the mold includes disposing said lead frame in said mold in such a manner that the molding resin flows in a direction substantially perpendicular to a pattern of said outer leads of said lead frame.

21. The method according to claim 10, wherein said lead frame is provided with outer leads formed within said lead frame, and wherein the steps of placing said lead frame includes disposing said lead frame in said mold so that the resin flows in a direction which is inclined at a predetermined angle relative to a pattern of said outer leads of said lead frame.

22. The method according to claim 21, wherein the lead frame includes outer leads extending into two longitudinal directions and two lateral directions, and wherein the step of injecting the molding resin is effected when the lead frame is placed in said mold.

23. The method according to claim 10, wherein the step of providing groups of cavities includes arranging such cavities that apexes of each adjacent pair of cavities are connected by a runner, and wherein the step of injecting the molding resin is effected in such a manner that the molding resin flows through the runner.

24. The method according to claim 10, wherein the step of injecting the molding resin includes providing a plurality of plungers connected to a rod of a molding machine through a rigid plate means, and downwardly driving the rod to simultaneously drive said plungers to force the molding resin out of said pots.

25. The method according to claim 14, wherein the step of injecting further includes moving said rod through a speed control to a predetermined position, changing the speed control movement of the rod to a load control of the rod, and injecting the molding resin by operation of a driving mechanism.

* * * * *